United States Patent
Wang et al.

[11] Patent Number: 6,100,756
[45] Date of Patent: Aug. 8, 2000

[54] METHOD AND APPARATUS FOR HIGH EFFICIENCY POWER AMPLIFICATION

[75] Inventors: Shay-Ping T. Wang, Long Grove, Ill.; Stephen Chih-Hung Ma, Mesa, Ariz.; James Edward Mitzlaff, Arlington Heights; Shaowei Pan, Lake Zurich, both of Ill.

[73] Assignee: Motorola, Inc., Schaumburg, Ill.

[21] Appl. No.: 09/157,682

[22] Filed: Sep. 21, 1998

[51] Int. Cl.$^7$ .................................................. H03F 3/38
[52] U.S. Cl. ........................................ 330/10; 330/136
[58] Field of Search ............................ 330/10, 136, 149, 330/207 A, 251

[56] References Cited

U.S. PATENT DOCUMENTS

| | | | |
|---|---|---|---|
| 4,162,455 | 7/1979 | Birt | 330/10 |
| 5,023,566 | 6/1991 | El-Hamamsy et al. | 330/251 |
| 5,251,330 | 10/1993 | Chiba et al. | 455/91 |
| 5,757,173 | 5/1998 | Agiman | 323/282 |
| 5,812,010 | 9/1998 | Hook | 327/381 |
| 5,861,777 | 1/1999 | Sigmon et al. | 330/136 |
| 5,929,702 | 7/1999 | Myers et al. | 330/136 |

OTHER PUBLICATIONS

Article entitled "Class–S High–Efficiency Amplitude Modulator", published by RF Design—vol. 17, No. 5 (May 1994).

*Primary Examiner*—Steven J. Mottola
*Attorney, Agent, or Firm*—Dana B. LeMoine; Timothy J. Lorenz

[57] ABSTRACT

A method and apparatus for efficient power amplification of a wideband signal with a correspondingly wide modulation bandwidth includes an envelope detector (220), a soft switch modulator (270), and a power amplifier (260). The soft switch modulator (270) drives a high side switch (330), and a low side switch (340) to amplify a pulsewidth modulated signal. Electrical signal path lengths within a soft switch driver (320) are dynamically modified so as to always turn off one switch before turning on the other.

13 Claims, 4 Drawing Sheets

METHOD AND APPARATUS FOR HIGH EFFICIENCY POWER AMPLIFICATION

FIELD OF THE INVENTION

This invention relates in general to power amplifiers and, in particular, to high efficiency, wideband power amplifiers.

BACKGROUND OF THE INVENTION

Various apparatus are available for amplifying signals. In amplifier applications that involve the amplification and transmission of modulated signals, a premium is placed on amplifier efficiency. In addition, because many applications require a wide bandwidth, a premium is placed on the ability to efficiently create a high fidelity reproduction of a wideband signal.

Communications devices, which often transmit wideband signals, are an example of an application where these qualities are in demand. Low distortion allows the communications devices to communicate more reliably, and high efficiency allows the devices to operate longer on a single battery.

One method of achieving increased efficiency is to use envelope elimination and restoration (EER)-type amplifiers. EER is a technique through which highly efficient but nonlinear radio frequency (RF) power amplifiers can be combined with other, highly efficient amplifiers to produce a high efficiency linear amplifier system. The signal to be amplified is split into two paths: an amplitude path, and a phase path. The detected envelope is amplified efficiently in the amplitude path by a class S or other highly efficient power amplifier which operates on the bandwidth of the RF envelope rather than the RF bandwidth. The phase modulated carrier in the phase path is then amplitude modulated by the amplified envelope signal, creating an amplified replica of the input signal.

Class S modulators are generally efficient, however, because they are switching devices, they exhibit some power loss due to the action of the switches. Class S modulators utilized in the amplitude path desirably function as very efficient amplifiers. It is desirable, therefore, to reduce switching losses associated with class S amplifiers.

Accordingly, a need exists for a power amplifier that efficiently amplifies a wide band RF signal.

DETAILED DESCRIPTION OF THE DRAWINGS

Generally, the present invention helps solve the above-identified problems by providing an amplifier that efficiently amplifies wideband signals with correspondingly wide modulation bandwidths.

Figure 1:
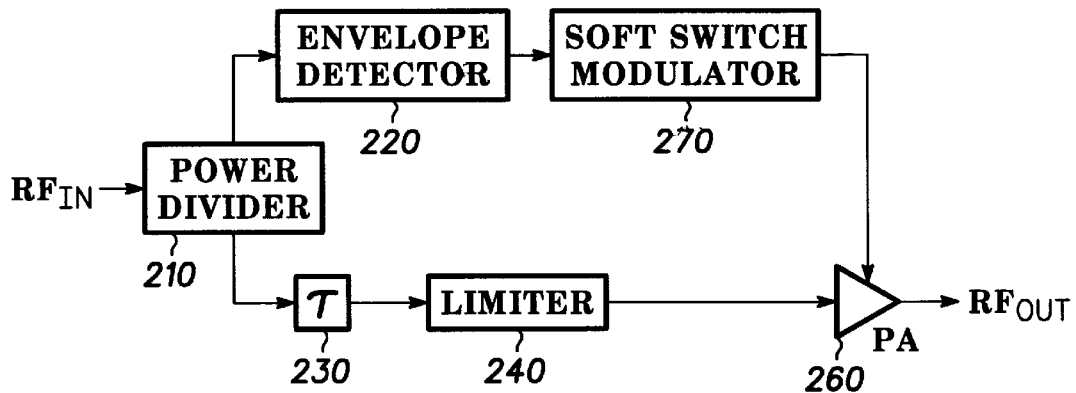
FIG. 1 shows a diagram of an amplifier in accordance with a preferred embodiment of the present invention.

FIG. 1 shows a diagram of an amplifier in accordance with a preferred embodiment of the present invention. EER-type amplifier 10 includes power divider 210, envelope detector 220, soft switch modulator 270, time delay element 230, limiter 240, and power amplifier 260. EER-type amplifier 10 receives an RF input into power divider 210. Power divider 210 splits the RF input signal into an amplitude path which feeds envelope detector 220, and a phase path which feeds time delay element 230.

The phase path of EER-type amplifier 10 includes time delay element 230, limiter 240 and power amplifier 260. Time delay element 230, which produces a delay substantially equal to that introduced by soft switch modulator 270 in the amplitude path, receives an output from power divider 210. Limiter 240 receives the time delayed signal output from time delay element 230, and amplitude limits the signal. Limiter 240 can be omitted, or it can perform soft limiting, but limiter 240 preferably performs hard limiting so that the output of limiter 240 includes phase information with little or no amplitude information. After limiting, with the amplitude information removed, the resultant signal is the phase modulated carrier. The phase modulated carrier output from limiter 240 is input to power amplifier 260. Power amplifier 260 is any amplifier stage capable of being modulated, and it is preferably a field effect transistor (FET) amplifier. The drain of the FET is conventionally connected to a DC power source; however, as will be discussed below, in a preferred embodiment exemplified herein, the drain of the FET is driven with a signal, resulting in an amplitude modulated output signal.

In a preferred embodiment, time delay element 230 is used in the phase path because it is desirable to recombine the signals from the amplitude path and the phase path after each has been subjected to substantially equal delays. The absolute delay of time delay element 230 is such that the total delay in the phase path is substantially equal to the total delay in the amplitude path. Time delay element 230 is shown as the first element in the phase path; however, the actual placement of time delay element 230 within the phase path is not a limitation of the present invention. Because the function of time delay element 230 is to balance the delays in the phase path and the amplitude path, the actual position of time delay element 230 in the phase path is not important. In an alternate embodiment of the present invention the delay in soft switch modulator 270 is minimized by appropriate control such that time delay element 230 becomes unnecessary and is omitted.

Alternate embodiments of the present invention substantially match the delay in the two paths using circuit arrangements other than the one using time delay element 230 alone. In a first alternate embodiment, multiple delay lines, one in each of the phase path and amplitude path are used. In this case, the absolute delay of any one delay line assumes less importance, and the differential delay between the two delay lines is used to match the delays in the two paths. In another alternate embodiment, a differential delay line, such as a surface acoustic wave (SAW) delay line, with one input and multiple outputs is used as a combination of power divider 210 and time delay element 230. In this alternate embodiment, as in the first alternate embodiment, the differential delay is used to match the delay in the two paths.

The amplitude path of EER-type amplifier 10 includes envelope detector 220 and soft switch modulator 270. Envelope detector 220 detects the envelope of the RF input signal and outputs an envelope signal which represents the amplitude information included in the original RF input signal. Envelope detector 220 is preferably a diode detector; however, other types of detectors, such as a synchronous detector based upon a double balanced mixer, could be used. Additionally, in an alternate embodiment, the envelope signal is computed from baseband inphase (I) and quadrature (Q) signals.

Soft switch modulator 270 amplifies the envelope signal output from envelope detector 220 and drives the drain bias of power amplifier 260. Soft switch modulator 270 amplifies the envelope signal to a level commensurate with the desired output. The output of soft switch modulator 270 is the power supply for power amplifier 260, and the resultant remodulation of the phase modulated carrier restores the envelope, producing an amplified replica of the input signal.

The EER-type amplifier of FIG. 1 varies the drain bias of power amplifier 260 in such a way as to maintain operation near saturation and therefore in a region of high efficiency. Because the highly efficient power amplifier 260 consumes the majority of the power consumed in EER-type amplifier 10, the entire circuit is considerably more efficient than conventional amplifiers.

Figure 2:
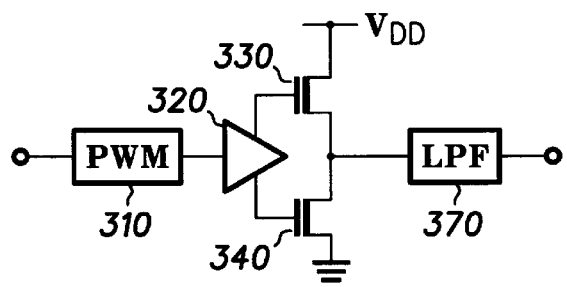
FIG. 2 shows a diagram of a soft switch modulator in accordance with a preferred embodiment of the present invention.

FIG. 2 shows a diagram of a soft switch modulator in accordance with a preferred embodiment of the present invention. Soft switch modulator 270 includes pulsewidth modulator (PWM) 310, soft switch driver 320, high side switch 330, low side switch 340 and low pass filter 370. High side switch 330 is coupled between a voltage potential, represented in FIG. 3 by Vdd, and the input to low pass filter 370. Low side switch 340 is coupled between a reference potential, represented in FIG. 3 by a ground signal, and the input to low pass filter 370.

In operation, PWM 310 receives the envelope signal from envelope detector 220(FIG. 1). PWM 310 pulsewidth modulates the envelope signal so that soft switch driver 320 is driven with a pulse train having a duty cycle substantially proportional to the amplitude of the envelope of the original RF input signal. Soft switch driver 320 alternately drives switches 330 and 340 such that when the pulsewidth modulated signal is high, switch 330 is on and switch 340 is off, and when the pulsewidth modulated signal is low, switch 330 is off and switch 340 is on. When switch 330 is on and switch 340 is off, the input to low pass filter 370 is electrically coupled to the voltage potential, and when switch 340 is on and switch 330 is off, the input to low pass filter 370 is electrically coupled to the reference potential. The switching action of switches 330 and 340 creates an amplified pulsewidth modulated signal at the input to low pass filter 370, where the signal switches between Vdd and ground. Low pass filter 370 smoothes the signal so that the resulting output signal is an amplified replica of the envelope signal input to PWM 310.

In a preferred embodiment, high side switch 330 and low side switch 340 are implemented with field effect transistors (FETs). One skilled in the art will appreciate that there are other ways to implement switches for the purposes of the present invention.

The switching frequency of PWM 310 is preferably maintained at a frequency higher than the bandwidth of the envelope signal, and in a preferred embodiment, the switching frequency is at least ten times the bandwidth of the envelope signal.

It is desirable to have the combined operation of soft switch driver 320 and switches 330 and 340 be efficient as possible. If the outputs of soft switch driver were to switch at the same time such that one output was transitioning from low to high and the other output was transitioning high to low simultaneously, a region in time would exist where both switches 330 and 340 would be conducting, at least in part. This would result in an inefficiency because some current would travel from Vdd through both switches 330 and 340 to the reference potential. In a preferred embodiment of the present invention, this inefficiency is reduced by not overlapping the "on" times of the two switches. To that end, soft switch driver preferably operates such that switch 330 and 340 are not on at the same time, at least in part.

Figure 3:
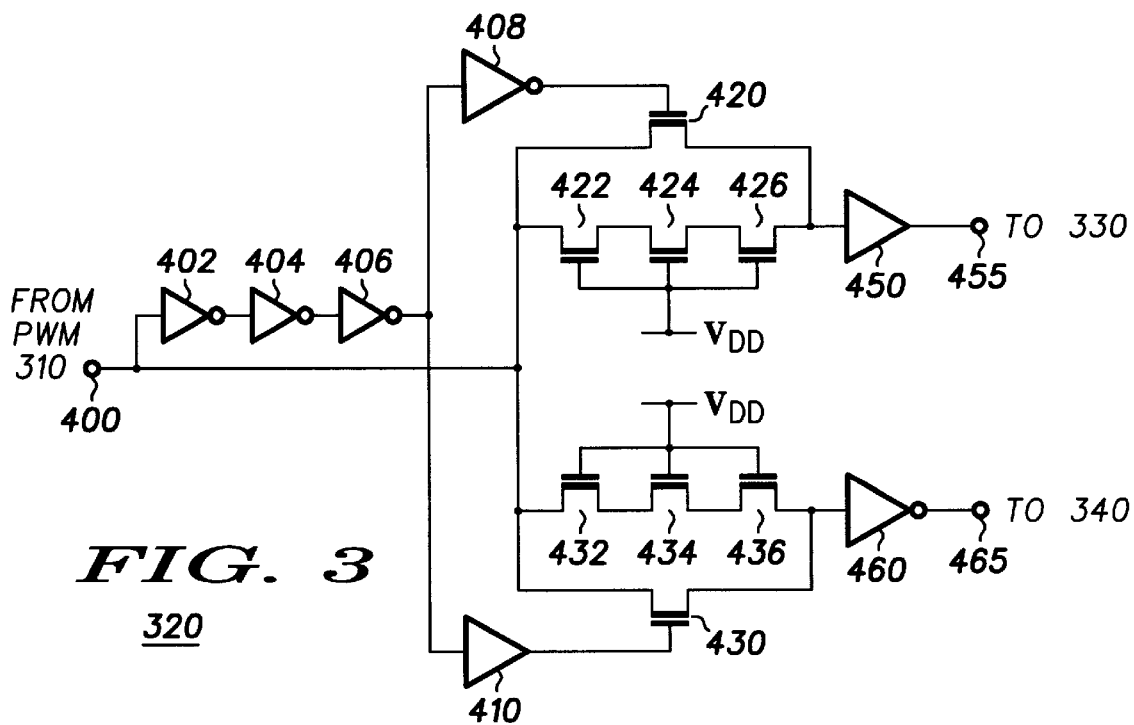
FIG. 3 shows a diagram of a soft switch driver in accordance with a preferred embodiment of the present invention.

FIG. 3 shows a soft switch driver in accordance with a preferred embodiment of the present invention. Soft switch driver 320 includes inverters 402, 404, 406, and 408, and buffer 410. Soft switch driver 320 further includes transistors 420, 422, 424, 426, 430, 432, 434, and 436. Soft switch driver 320 also includes buffer 450 and inverter 460.

Input 400 is driven by PWM 310 (FIG. 2), output 455 drives high side switch 330 (FIG. 2), and output 465 drives low side switch 340 (FIG. 2). When soft switch driver 320 is in steady state, and input 400 is low, output 455 is low, and output 465 is high. Conversely, when input 400 is high, output 455 is high, and output 465 is low. When input 400 changes state, both outputs 455 and 465 also change state. Soft switch driver 320 operates such that the output transitioning from high to low transitions prior to the output transitioning from low to high. This operation is described in more detail below.

When input 400 is low, the output of inverter 406 is high resulting in transistor 430 being on, and the output of inverter 408 is low resulting in transistor 420 being off. With transistor 430 on, the shortest path from input 400 to output 465 includes transistor 430, and does not include transistors 432, 434, and 436. With transistor 420 off, the shortest signal path from input 400 to output 455 includes transistors 422, 424, and 426, and does not include transistor 420. As just described, when input 400 is low, the signal path from input 400 to output 465 is shorter than the signal path from input 400 to output 455. When input 400 transitions from low to high, output 465 transitions from high to low before output 455 transitions from low to high because the signal path from input 400 to output 465 is shorter than the signal path from input 400 to output 455.

After the input transitions from low to high, and soft switch driver 20 reaches steady state, transistor 420 is on, and transistor 430 is off. Therefore, when input 400 is high, the signal path from input 400 to output 455 is shorter than the signal path from input 400 to output 465. When input 400 transitions from high to low, output 455 transitions from high to low before output 465 transitions from low to high.

The signal path from input 400 to output 455 which includes transistor 420 is a short steady-state signal path, and the signal path from input 400 to output 455 which includes transistors 422, 424, and 426 is a long steady-state signal path. This is because the cumulative delay in the long steady state signal path is longer than the cumulative delay in the short steady state signal path. Transistor 420 acts as an in-line switch because in one state, it is closed and provides the short steady-state signal path, and in another state, it is open and prevents a signal from propagating in the short steady-state signal path. The signal paths from input 400 to output 465 also include a short steady-state signal path, and a long steady-state signal path. The short path includes transistor 430 which acts as an in-line switch, and the long path includes transistors 432, 434, and 436.

Transistors 432, 434, 436, 422, 424, and 426 function as delay elements. One skilled in the art will appreciate that transistors are not the only means to create delay in a circuit, and that other means of generating delay can be used while still practicing the present invention.

Inverters 402, 404, 406, 408, and buffer 410 make up a control circuit for controlling the in-line switches represented by transistors 420 and 430 in FIG. 3. The cumulative delay in the control circuit is preferably longer than the cumulative delay in either of the long steady-state signal paths from input 400 to output 455 or output 465. This allows the outputs to reach steady-state after an input transition prior to the control circuit changing which output is subject to a short path and which output is subject to a long path. Inverter 408 and buffer 410 desirably have a substantially equal amount of delay. This balances the total delay from the input to the two in-line switches represented by transistors 420 and 430. Buffer 410 can be implemented in many different ways, including the use of a pass transistor.

Soft switch driver 320 provides an advantageous means for providing two switching outputs, where one output switches from high to low prior to a second output switching from low to high. When these outputs are applied to high side switch 330 (FIG. 2), and low side switch 340 (FIG. 2), the result is a power savings as described with reference to FIG. 2.

Figure 4:
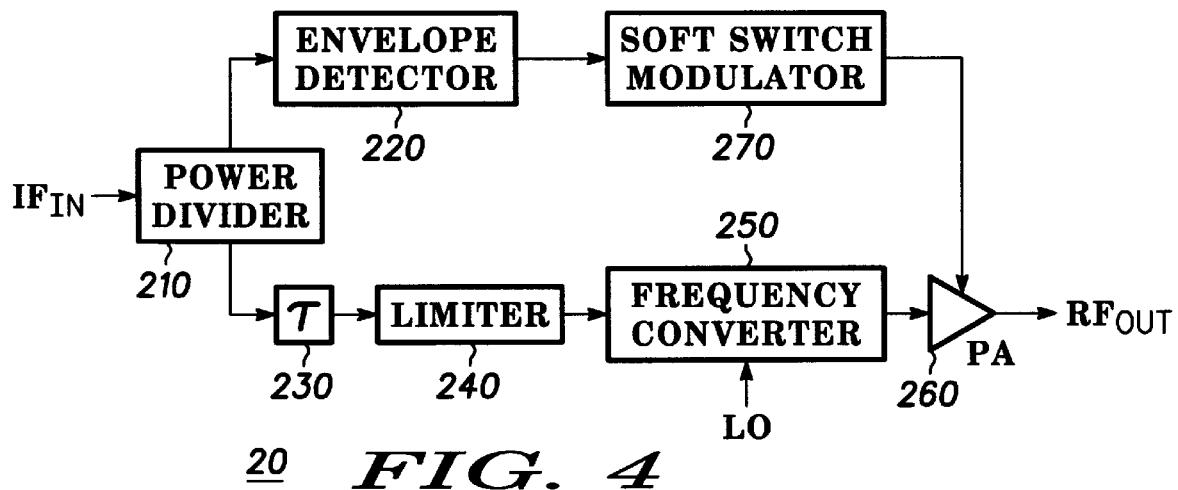
FIG. 4 shows a diagram of an amplifier in accordance with an alternate embodiment of the present invention.

FIG. 4 shows a diagram of an amplifier in accordance with an alternate embodiment of the present invention. In FIG. 4 an intermediate frequency (IF) signal is shown as the input signal to EER-type amplifier 20. The IF signal is input into power divider 210. Power divider 210 functions to split the input signal into the amplitude path and the phase path. The amplitude path feeds envelope detector 220, and the phase path feeds time delay element 230.

The amplitude path of EER-type amplifier 20 includes envelope detector 220 and soft switch modulator 270. These elements correspond to the elements of FIG. 1 which have like names and like reference numbers. In addition, soft switch modulator 270 corresponds to soft switch modulator 270 of FIG. 1, which was discussed in detail previously in connection with FIG. 2.

The phase path of EER-type amplifier 20 includes time delay element 230, limiter 240, frequency converter 250 and power amplifier 260. Time delay element 230, limiter 240 and power amplifier 260 correspond to the elements shown in FIG. 1 with like names and like reference numbers. In contrast to the embodiment shown in FIG. 1, the alternate embodiment of FIG. 4 includes frequency converter 250 in the phase path. Frequency converter 250 receives the signal in the phase path and also receives a local oscillator (LO) signal. Frequency converter 250 converts the frequency of the carrier signal to its final RF frequency using circuitry well known in the art, such as a mixer. The resulting signal is then used to drive power amplifier 260 which operates at the final RF frequency.

Because of the operation of frequency converter 250, the amplifier of FIG. 4 takes in a signal at a frequency different from the final RF frequency. FIG. 4 shows an IF signal input to EER-type amplifier 20. The IF input signal can be above or below the resultant RF frequency. In addition, one skilled in the art will understand that a baseband signal could also be used. Therefore, in the alternate embodiment exemplified in FIG. 4, the input signal can be at any frequency different from the RF frequency.

In this circuit arrangement, with frequency converter 250 being an integral part of the amplifier, the amplifier becomes more tightly integrated with the device that houses the amplifier. Tighter integration results in smaller, lower power devices, which are easier to manufacture.

Figure 5:
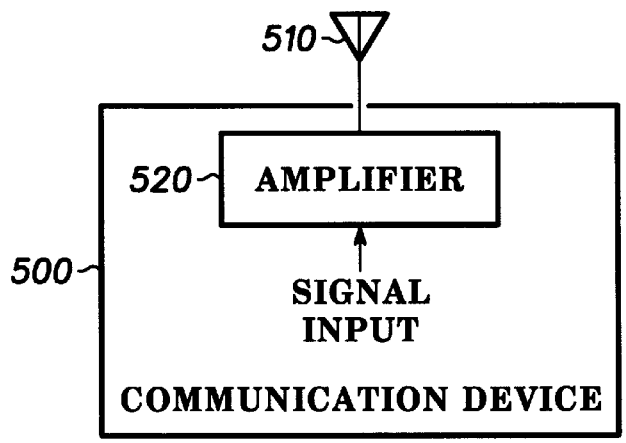
FIG. 5 shows a diagram of a communications device in accordance with a preferred embodiment of the present invention.

FIG. 5 shows a diagram of a communications device in accordance with a preferred embodiment of the present invention. Communications device 500 includes amplifier 520 and antenna 510. Amplifier 520 may comprise any of the amplifiers of the present invention, including for example, EER-type amplifier 10 (FIG. 1), soft switch modulator 270 (FIG. 2), or EER-type amplifier 20 (FIG. 4). Communications device 500 may be one of many different devices capable of communications. Examples include, but are not limited to, subscriber units in a communications system, radio receivers, transmitters, and transceivers, one-way and two-way pagers, cellular phones, other radiotelephones, and basestations.

Figure 6:
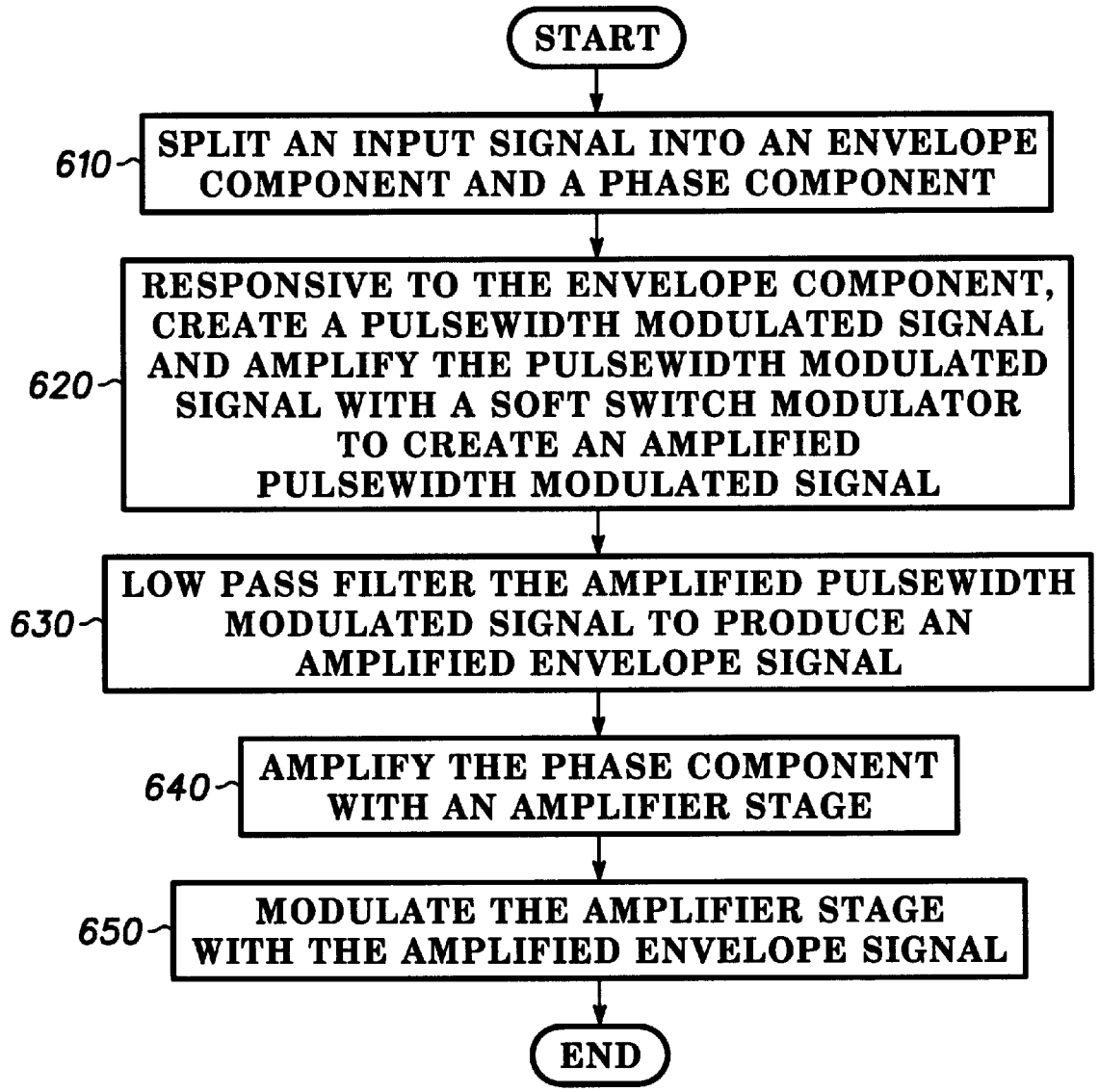
FIG. 6 shows a flowchart for a method of amplifying a signal in accordance with a preferred embodiment of the present invention.

FIG. 6 shows a flowchart for a method of amplifying a signal in accordance with a preferred embodiment of the present invention. Method 600 begins with step 610 where an input signal is split into an envelope component and a phase component. The envelope component is pulsewidth modulated to produce a pulsewidth modulated signal in step 620. The pulsewidth modulated signal has a duty cycle substantially proportional to the amplitude of the envelope component.

Also in step 620, the pulsewidth modulated signal is amplified by a soft switch modulator to create an amplified pulsewidth modulated signal. The soft switch modulator is preferably implemented as in the exemplary embodiment shown in FIG. 2, and also as described in FIG. 7 below. Then in step 630, the amplified pulsewidth modulated signal is filtered to produce an amplified envelope signal.

In step 640 the phase component is amplified with a power amplifier. Finally, in step 650, the signals in the amplitude path and the phase path are brought back together when the power amplifier is modulated with the amplified envelope signal. This modulation can be performed in a number of ways, but in a preferred embodiment, it is performed by modulating the drain bias of a field effect transistor (FET) amplifier. In this way, the amplified envelope signal functions as the power supply of the final RF amplifier. The result is a high fidelity RF output signal which is an amplified and optionally frequency converted version of the input signal.

It is desirable to recombine the amplitude of the signal with the phase of the signal after each has undergone a similar delay. Depending on the circuit elements used in amplifying the envelope signal and in amplifying the phase component, a time delay may be necessary in one or more signal paths in order to time align the recombination of the amplitude and phase.

Figure 7:
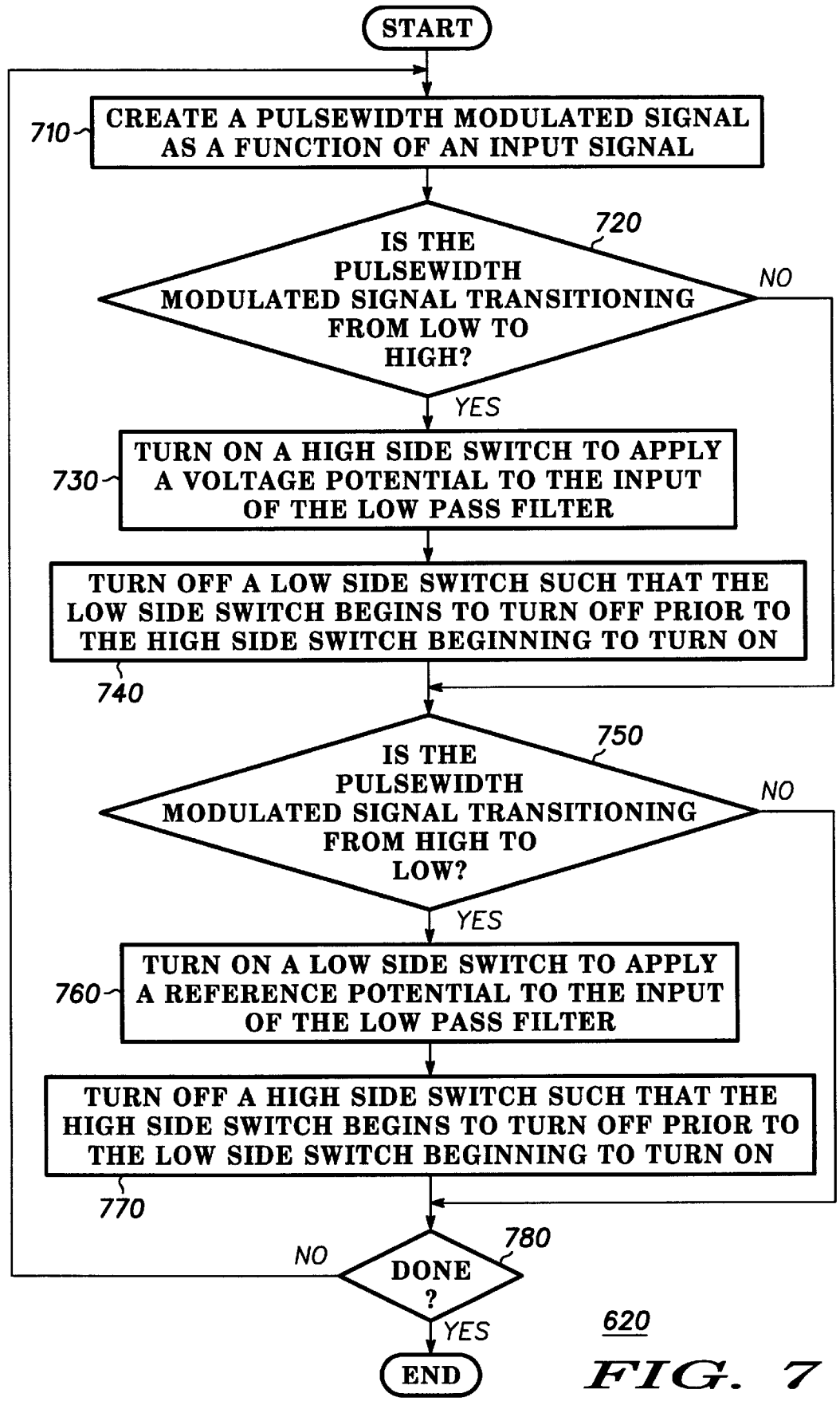
FIG. 7 shows a flowchart for a method of amplifying a signal in accordance with a preferred embodiment of the present invention.

FIG. 7 shows a flowchart for a method of amplifying a signal in accordance with a preferred embodiment of the present invention. Method 620 begins with step 710 where a pulsewidth modulated signal is created as a function of an input signal. The pulsewidth modulated signal has a duty cycle substantially proportional to the amplitude of the input signal.

Then in step 720, a determination is made as to whether the pulsewidth modulated signal is transitioning from low to high. If so, then method 620 proceeds with step 730, otherwise, method 620 proceeds with step 750. In step 730, a high side switch is turned on to apply a voltage potential to the input of the low pass filter. In step 740, a low side switch is turned off such that the low side switch begins to turn off prior to the high side switch beginning to turn on in step 730.

Then in step 750, a determination is made as to whether the pulsewidth modulated signal is transitioning from high to low. If so, then method 620 proceeds with step 760, otherwise, method 620 proceeds with step 780. In step 760, a low side switch is turned on to apply a reference potential to the input of the low pass filter. In step 770, a high side switch is turned off such that the high side switch begins to turn off prior to the low side switch beginning to turn on in step 760.

Then in step 780, if method 620 is done amplifying the input signal, processing ends. Otherwise, processing continues with step 710.

In summary, the method and apparatus of the present invention as described is a versatile way of achieving efficient amplification of a signal with a large RF bandwidth and a correspondingly large modulation bandwidth. Embodiments of an EER-type amplifier which utilizes a soft switch modulator have been described. The soft switch modulator efficiently amplifies a wideband envelope and allows the EER-type amplifier to efficiently amplify a wideband RF signal having a correspondingly wideband modulation bandwidth.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. An apparatus, comprising:
   a pulsewidth modulator coupled to an input of said apparatus, said pulsewidth modulator having an output;
   a soft switch driver having an input responsive to said output of said pulsewidth modulator, and having first and second outputs which are complementary when in steady-state, said soft switch driver further having:
      a first short steady-state signal path from the input of the soft switch driver to the first output, wherein the first short steady-state signal path includes a first in-line switch capable of opening the first short steady-state signal path responsive to a first control input;
      a first long steady-state signal path from the input of the soft switch driver to the first output;
      a second short steady-state signal path from the input of the soft switch driver to the second output, wherein the second short steady-state signal path includes a second in-line switch capable of opening the second short steady-state signal path responsive to a second control input;
      a long steady-state signal path from the input of the soft switch driver to the second output; and
      a control circuit responsive to the input of the soft switch driver, wherein said control circuit drives the first control input of the first in-line switch and the second control input of the second in-line switch;
   a low pass filter having an input, and having an output coupled to an output of the apparatus;
   a high side switch driven by the first output of the soft switch driver, and coupled between a voltage potential and the input of the low pass filter such that when the high side switch is closed, the input of the low pass filter is electrically coupled to the voltage potential; and
   a low side switch driven by the second output of the soft switch driver and coupled between a reference potential and the input of the low pass filter such that when the low side switch is closed, the input of the low pass filter is electrically coupled to the reference potential, wherein said soft switch driver drives said first and second outputs to complementary states responsive to said output of said pulsewidth modulator such that there is a low transitioning output and a high transitioning output, and the electrical signal length through said soft switch driver is shorter for the low transitioning output than for the high transitioning output.

2. The apparatus of claim 1 wherein said high side switch and said low side switch are transistors.

3. The apparatus of claim 1 wherein said first long steady state signal path includes:
   at least one delay element having a cumulative delay greater than the first in-line switch.

4. The apparatus of claim 3 wherein said control circuit includes at least one delay element having a cumulative delay greater than the cumulative delay of the first long steady-state signal path.

5. The apparatus of claim 1 wherein said second long steady state signal path includes:
   at least one delay element having a cumulative delay greater than the second in-line switch.

6. The apparatus of claim 5 wherein said control circuit includes at least one delay element having a cumulative delay greater than the cumulative delay of the second long steady-state signal path.

7. An apparatus for amplifying an input signal, said apparatus comprising:
   a power amplifier stage for amplifying said input signal, said power amplifier stage having a modulating input;
   an envelope detector for detecting an envelope of said input signal; and
   a soft switch modulator for amplifying said envelope of said input signal, said soft switch modulator having an output which drives said modulating input of said power amplifier stage, said soft switch modulator comprising:
      a pulsewidth modulator coupled to an input of said soft switch modulator, said pulsewidth modulator having an output;
      a soft switch driver having an input responsive to said output of said pulsewidth modulator, and having first and second outputs which are complementary when in steady-state, said soft switch driver comprising:
         a first short steady-state signal path from the input of the soft switch driver to the first output, wherein the first short steady-state signal path includes a first in-line switch capable of opening the first short steady-state signal path responsive to a first control input;
         a first long steady-state signal path from the input of the soft switch driver to the first output;
         a second short steady-state signal path from the input of the soft switch driver to the second output, wherein the second short steady-state signal path includes a second in-line switch capable of opening the second short steady-state signal path responsive to a second control input;
         a long steady-state signal path from the input of the soft switch driver to the second output; and
         a control circuit responsive to the input of the soft switch driver, wherein said control circuit drives the first control input of the first in-line switch and the second control input of the second in-line switch;

a low pass filter having an input, and having an output coupled to an output of the soft switch modulator;

a high side switch driven by the first output of the soft switch driver, and coupled between a voltage potential and the input of the low pass filter such that when the high side switch is closed, the input of the low pass filter is electrically coupled to the voltage potential; and a low side switch driven by the second output of the soft switch driver and coupled between a reference potential and the input of the low pass filter such that when the low side switch is closed, the input of the low pass filter is electrically coupled to the reference potential, wherein said soft switch driver drives said first and second outputs to complementary states responsive to said output of said pulsewidth modulator such that there is a low transitioning output and a high transitioning output, and the electrical signal length through said soft switch driver is shorter for the low transitioning output than for the high transitioning output.

8. The apparatus of claim 7 wherein said first long steady-state signal path includes:

at least one delay element having a cumulative delay greater than the first in-line switch.

9. The apparatus of claim 8 wherein said control circuit includes at least one delay element having a cumulative delay greater than the cumulative delay of the first long steady-state signal path.

10. The apparatus of claim 7 wherein said second long steady-state signal path includes:

at least one delay element having a cumulative delay greater than the second in-line switch.

11. The apparatus of claim 10 wherein said control circuit includes at least one delay element having a cumulative delay greater than the cumulative delay of the second long steady-state signal path.

12. A communications device including an amplifier wherein said amplifier comprises:

a pulsewidth modulator coupled to an input of said amplifier, said pulsewidth modulator having an output;

a soft switch driver having an input responsive to said output of said pulsewidth modulator, and having first and second outputs which are complementary when in steady-state, said soft switch driver comprising:

a first short steady-state signal path from the input of the soft switch driver to the first output, wherein the first short steady-state signal path includes a first in-line switch capable of opening the first short steady-state signal path responsive to a first control input;

a first long steady-state signal path from the input of the soft switch driver to the first output;

a second short steady-state signal path from the input of the soft switch driver to the second output, wherein the second short steady-state signal path includes a second in-line switch capable of opening the second short steady-state signal path responsive to a second control input;

a long steady-state signal path from the input of the soft switch driver to the second output; and a control circuit responsive to the input of the soft switch driver, wherein said control circuit drives the first control input of the first in-line switch and the second control input of the second in-line switch a low pass filter having an input, and having an output coupled to an output of the amplifier;

a high side switch driven by the first output of the soft switch driver, and coupled between a voltage potential and the input of the low pass filter such that when the high side switch is closed, the input of the low pass filter is electrically coupled to the voltage potential; and a low side switch driven by the second output of the soft switch driver and coupled between a reference potential and the input of the low pass filter such that when the low side switch is closed, the input of the low pass filter is electrically coupled to the reference potential, wherein said soft switch driver drives said first and second outputs to complementary states responsive to said output of said pulsewidth modulator such that there is a low transitioning output and a high transitioning output, and the electrical signal length through said soft switch driver is shorter for the low transitioning output than for the high transitioning output.

13. The communications device of claim 12 wherein said first long steady-state signal path includes:

at least one delay element having a cumulative delay greater than the first in-line switch.

* * * * *